(12) United States Patent
Bolender et al.

(10) Patent No.: US 9,406,453 B2
(45) Date of Patent: Aug. 2, 2016

(54) METHODS AND APPARATUS FOR CAPACITIVELY DETECTING KEY MOTION AND FINGER PRESENCE ON A MAGNETIC KEYBOARD KEY

(71) Applicant: SYNAPTICS INCORPORATED, San Jose, CA (US)

(72) Inventors: Robert J. Bolender, San Jose, CA (US); Joseph Kurth Reynolds, Alviso, CA (US)

(73) Assignee: Synaptics Incorporated, San Jose, CA (US)

( * ) Notice: Subject to any disclaimer, the term of this patent is extended or adjusted under 35 U.S.C. 154(b) by 209 days.

(21) Appl. No.: 14/146,811

(22) Filed: Jan. 3, 2014

(65) Prior Publication Data

US 2014/0190811 A1 Jul. 10, 2014

Related U.S. Application Data

(60) Provisional application No. 61/748,923, filed on Jan. 4, 2013.

(51) Int. Cl.
| | |
|---|---|
| *G01R 27/26* | (2006.01) |
| *H01H 3/12* | (2006.01) |
| *H01H 13/7065* | (2006.01) |
| *G06F 3/02* | (2006.01) |
| *H03K 17/96* | (2006.01) |
| *H03K 17/98* | (2006.01) |

(52) U.S. Cl.
CPC ........... *H01H 3/122* (2013.01); *G01R 27/2605* (2013.01); *G06F 3/0202* (2013.01); *H01H 13/7065* (2013.01); *H01H 2217/01* (2013.01); *H01H 2221/04* (2013.01); *H03K 17/9622* (2013.01); *H03K 17/98* (2013.01); *H03K 2217/96079* (2013.01)

(58) Field of Classification Search
CPC .............................. G06F 3/0202; G10H 1/057
USPC ................................................... 324/660–662
See application file for complete search history.

(56) References Cited

U.S. PATENT DOCUMENTS

| | | | | |
|---|---|---|---|---|
| 2,482,548 | A | * 9/1949 | Kerkhof | ................. G10H 1/057 84/687 |
| 5,463,388 | A | 10/1995 | Boie et al. | |
| 8,309,870 | B2 | 11/2012 | Peterson et al. | |
| 2001/0000125 | A1 | 4/2001 | Zimmerman et al. | |
| 2007/0273560 | A1 | 11/2007 | Hua et al. | |

(Continued)

OTHER PUBLICATIONS

International Preliminary Report on Patentability issued in the corresponding application No. PCT/US2014/010172, mailed Jul. 16, 2015 (11 pages).

(Continued)

*Primary Examiner* — Vincent Q Nguyen
(74) *Attorney, Agent, or Firm* — Osha Liang LLP

(57) ABSTRACT

Devices and methods for capacitively sensing key cap position during the initial and latter stages of a keystroke. A key assembly includes a stationary key guide magnet, a movable key cap magnet, and a transmitter/receiver electrode pair. One or both of the electrodes underlies the key cap. The capacitance change between the electrodes during a keystroke includes the capacitance change between the key cap and the electrode pair, and the change in capacitance between the key cap and the key guide. Key cap position may thus be accurately detected throughout the entire keystroke.

6 Claims, 7 Drawing Sheets

(56) References Cited

U.S. PATENT DOCUMENTS

| | | |
|---|---|---|
| 2008/0264770 A1 | 10/2008 | Purcocks |
| 2008/0302647 A1 | 12/2008 | Villain et al. |
| 2010/0243420 A1 | 9/2010 | Lin |
| 2011/0303521 A1 | 12/2011 | Niu et al. |
| 2012/0001775 A1 | 1/2012 | Sellers |
| 2012/0228111 A1 | 9/2012 | Peterson et al. |
| 2012/0268384 A1 | 10/2012 | Peterson et al. |
| 2012/0299832 A1* | 11/2012 | Peterson .............. G06F 3/0202 345/168 |

OTHER PUBLICATIONS

International Searching Authority, Korean Intellectual Property Office, International Search Report and Written Opinion for International Application No. PCT/US2014/010172, mailed May 19, 2014.

International Searching Authority, Korean Intellectual Property Office, International Search Report and Written Opinion for International Application No. PCT/US2014/010196, mailed Jun. 3, 2014.

Office Action issued in the related U.S. Appl. No. 14/138,739, mailed Dec. 17, 2015 (14 pages).

\* cited by examiner

METHODS AND APPARATUS FOR CAPACITIVELY DETECTING KEY MOTION AND FINGER PRESENCE ON A MAGNETIC KEYBOARD KEY

CROSS-REFERENCE TO RELATED APPLICATIONS

This application claims the benefit of U.S. Provisional Application No. 61/748,923 filed Jan. 4, 2013.

FIELD OF THE INVENTION

This invention generally relates to electronic devices.

BACKGROUND OF THE INVENTION

Pressable touchsurfaces (touch surfaces which can be pressed) are widely used in a variety of input devices, including as the surfaces of keys or buttons for keypads or keyboards, and as the surfaces of touch pads or touch screens. It is desirable to improve the usability of these input systems.

FIG. 2 shows a graph 200 of an example tactile response curve associated with the "snapover" haptic response found in many keys enabled with metal snap domes or rubber domes. Specifically, graph 200 relates force applied to the user by a touchsurface of the key and the amount of key displacement (movement relative to its unpressed position). The force applied to the user may be a total force or the portion of the total force along a particular direction such as the positive or negative press direction. Similarly, the amount of key displacement may be a total amount of key travel or the portion along a particular direction such as the positive or negative press direction.

The force curve 210 shows four key press states 212, 214, 216, 218 symbolized with depictions of four rubber domes at varying amounts of key displacement. The key is in the "unpressed" state 212 when no press force is applied to the key and the key is in the unpressed position (i.e., "ready" position). In response to press input, the key initially responds with some key displacement and increasing reaction force applied to the user. The reaction force increases with the amount of key displacement until it reaches a local maximum "peak force" $F_1$ in the "peak" state 214. In the peak state 214, the metal snap dome is about to snap or the rubber dome is about to collapse. The key is in the "contact" state 216 when the keycap, snap dome or rubber dome, or other key component moved with the keycap makes initial physical contact with the base of the key (or a component attached to the base) with the local minimum "contact force" $F_2$. The key is in the "bottom" state 218 when the key has travelled past the "contact" state and is mechanically bottoming out, such as by compressing the rubber dome in keys enabled by rubber domes.

A snapover response is defined by the shape of the reaction force curve—affected by variables such as the rate of change, where it peaks and troughs, and the associated magnitudes. The difference between the peak force $F_1$ and the contact force $F_2$ can be termed the "snap." The "snap ratio" can be determined as $(F_1-F_2)/F_1$ (or as $100*(F_1-F_2)/F_1$, if a percent-type measure is desired).

Presently known keyboard systems for capacitively sensing keystroke position using a transmitter/receiver electrode pair underneath the key cap are limited in their ability to ability to accurately detect initial keystroke movement, inasmuch as the capacitive response is an inverse function of the square of the distance between the key cap and the electrode pair. Systems and methods are thus needed which overcome this limitation.

BRIEF SUMMARY OF THE INVENTION

Methods and apparatus are provided for capacitively sensing initial and latter stage keystroke position of a key cap. In an embodiment, a key assembly includes a stationary key guide magnet, a movable key cap magnet, and a transmitter/receiver electrode pair wherein one of the electrodes underlies the key cap and the other electrode underlies the key guide. In this way, the measured change in capacitance between the transmitter and receiver electrode in response to a downward keystroke includes both the change in capacitance between the key cap and the electrode pair, and the change in capacitance between the key cap and the key guide. Consequently, key cap position may be accurately detected in the early portion of the keystroke due to the change in capacitance between the key cap and the key guide, as well as in the latter portion of the keystroke due to the change in capacitance between the key cap and the electrode pair.

In an alternate embodiment of a key assembly, the transmitter/receiver electrode pair is disposed underneath the key cap, and the conductive element of the key guide (e.g., a magnet) is grounded or otherwise maintained at a constant voltage potential. Grounding the key guide inverts the capacitive response between the key cap and key guide responsive to a downward keystroke, further enhancing the ability of the transmitter/receiver electrode pair to accurately detect initial keystroke movement.

BRIEF DESCRIPTION OF DRAWINGS

Example embodiments of the present invention will hereinafter be described in conjunction with the appended drawings which are not to scale unless otherwise noted, where like designations denote like elements, and.

DETAILED DESCRIPTION OF THE INVENTION

The following detailed description is merely exemplary in nature and is not intended to limit the invention or the application and uses of the invention.

Various embodiments of the present invention provide input devices and methods that facilitate improved usability, thinner devices, easier assembly, lower cost, more flexible industrial design, or a combination thereof. These input devices and methods involve pressable touchsurfaces that may be incorporated in any number of devices. As some examples, pressable touchsurfaces may be implemented as surfaces of touchpads, touchscreens, keys, buttons, and the surfaces of any other appropriate input device. Thus, some non-limiting examples of devices that may incorporate pressable touchsurfaces include personal computers of all sizes and shapes, such as desktop computers, laptop computers, netbooks, ultrabooks, tablets, e-book readers, personal digital assistants (PDAs), and cellular phones including smart phones. Additional example devices include data input devices (including remote controls, integrated keyboards or keypads such as those within portable computers, or peripheral keyboards or keypads such as those found in tablet covers or stand-alone keyboards, control panels, and computer mice), and data output devices (including display screens and printers). Other examples include remote terminals, kiosks, point-of-sale devices, video game machines (e.g., video game consoles, portable gaming devices, and the like) and media devices (including recorders, editors, and players such as televisions, set-top boxes, music players, digital photo frames, and digital cameras).

The discussion herein focuses largely on rectangular touchsurfaces. However, the touchsurfaces for many embodiments can comprises other shapes. Example shapes include triangles, quadrilaterals, pentagons, polygons with other numbers of sides, shapes similar to polygons with rounded corners or nonlinear sides, shapes with curves, elongated or circular ellipses circles, combinations shapes with portions of any of the above shapes, non-planar shapes with concave or convex features, and any other appropriate shape.

In addition, although the discussion herein focuses largely on the touchsurfaces as being atop rigid bodies that undergo rigid body motion, some embodiments may comprise touchsurfaces atop pliant bodies that deform. "Rigid body motion" is used herein to indicate motion dominated by translation or rotation of the entire body, where the deformation of the body is negligible. Thus, the change in distance between any two given points of the touchsurface is much smaller than an associated amount of translation or rotation of the body.

Also, in various implementations, pressable touchsurfaces may comprise opaque portions that block light passage, translucent or transparent portions that allow light passage, or both.

Figure 1:
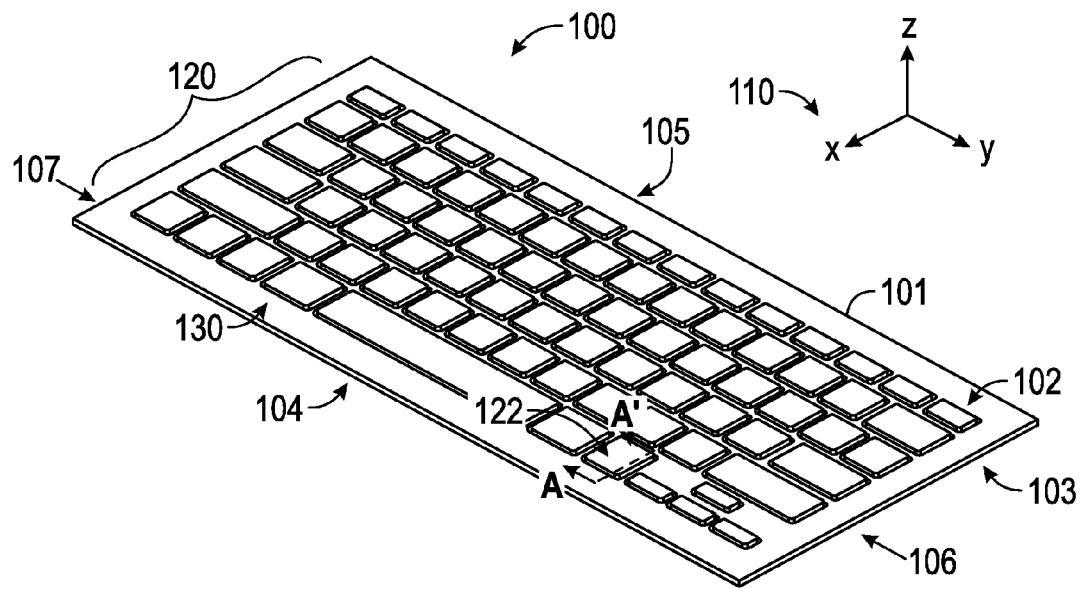
FIG. 1 shows an example keyboard that incorporates one or more implementations of key-based touchsurfaces configured in accordance with the techniques described herein.

FIG. 1 shows an example keyboard 100 that incorporates a plurality of (two or more) pressable key-based touchsurfaces configured in accordance with the techniques described herein. The example keyboard 100 comprises rows of keys 120 of varying sizes surrounded by a keyboard bezel 130. Keyboard 100 has a QWERTY layout, even though the keys 120 are not thus labeled in FIG. 1. Other keyboard embodiments may comprise different physical key shapes, key sizes, key locations or orientations, or different key layouts such as DVORAK layouts or layouts designed for use with special applications or non-English languages. In some embodiments, the keys 120 comprise keycaps that are rigid bodies, such as rigid rectangular bodies having greater width and breadth than depth (depth being in the Z direction as explained below). Also, other keyboard embodiments may comprise a single pressable key-based touchsurface configured in accordance with the techniques described herein, such that the other keys of these other keyboard embodiments are configured with other techniques.

Orientation terminology is introduced here in connection with FIG. 1, but is generally applicable to the other discussions herein and the other figures unless noted otherwise. This terminology introduction also includes directions associated with an arbitrary Cartesian coordinate system. The arrows 110 indicate the positive directions of the Cartesian coordinate system, but do not indicate an origin for the coordinate system. Definition of the origin will not be needed to appreciate the technology discussed herein.

The face of keyboard 100 including the exposed touchsurfaces configured to be pressed by users is referred to as the "top" 102 of the keyboard 100 herein. Using the Cartesian coordinate directions indicated by the arrows 110, the top 102 of the keyboard 100 is in the positive-Z direction relative to the bottom 103 of the keyboard 100. The part of the keyboard 100 that is typically closer to the body of a user when the keyboard 100 is in use atop a table top is referred to as the "front" 104 of the keyboard 100. In a QWERTY layout, the front 104 of the keyboard 100 is closer to the space bar and further from the alphanumeric keys. Using the Cartesian coordinate directions indicated by the arrows 110, the front 104 of the keyboard 100 is in the positive-X direction relative to the back 105 of the keyboard 100. In a typical use orientation where the top 102 of the keyboard 100 is facing upwards and the front 104 of the keyboard 100 is facing towards the user, the "right side" 106 of the keyboard 100 is to the right of a user. Using the Cartesian coordinate directions indicated by the arrows 110, the right side 106 of the keyboard 100 is in the positive-Y direction relative to the "left side" 107 of the keyboard 100. With the top 102, front 104, and right side 106 thus defined, the "bottom" 103, "back" 105, and "left side" 107 of the keyboard 100 are also defined.

Using this terminology, the press direction for the keyboard 100 is in the negative-Z direction, or vertically downwards toward the bottom of the keyboard 100. The X and Y directions are orthogonal to each other and to the press direction. Combinations of the X and Y directions can define an infinite number of additional lateral directions orthogonal to the press direction. Thus, example lateral directions include the X direction (positive and negative), the Y direction (positive and negative), and combination lateral directions with components in both the X and Y directions but not the Z direction. Motion components in any of these lateral directions is sometimes referred herein as "planar," since such lateral motion components can be considered to be in a plane orthogonal to the press direction.

Some or all of the keys of the keyboard 100 are configured to move between respective unpressed and pressed positions that are spaced in the press direction and in a lateral direction orthogonal to the press direction. That is, the touchsurfaces of these keys exhibit motion having components in the negative Z-direction and in a lateral direction. In the examples described herein, the lateral component is usually in the positive X-direction or in the negative X-direction for ease of understanding. However, in various embodiments, and with reorientation of select key elements as appropriate, the lateral separation between the unpressed and the pressed positions may be solely in the positive or negative X-direction, solely in the positive or negative Y-direction, or in a combination with components in both the X and Y directions.

Thus, these keys of the keyboard 100 can be described as exhibiting "diagonal" motion from the unpressed to the pressed position. This diagonal motion is a motion including both a "Z" (or vertical) translation component and a lateral (or planar) translation component. Since this planar translation occurs with the vertical travel of the touchsurface, it may be called "planar translational responsiveness to vertical travel" of the touchsurface, or "vertical-lateral travel."

Some embodiments of the keyboard 100 comprise keyboards with leveled keys that remain, when pressed during normal use, substantially level in orientation through their respective vertical-lateral travels. That is, the keycaps of these leveled keys (and thus the touchsurfaces of these keys) exhibit little or no rotation along any axes in response to presses that occur during normal use. Thus, there is little or no roll, pitch, and yaw of the keycap and the associated touchsurfaces remain relatively level and substantially in the same orientation during their motion from the unpressed position to the pressed position.

In various embodiments, the lateral motion associated with the vertical-lateral travel can improve the tactile feel of the key by increasing the total key travel for a given amount of vertical travel in the press direction. In various embodiments, the vertical-lateral travel also enhances tactile feel by imparting to users the perception that the touchsurface has travelled a larger vertical distance than actually travelled. For example, the lateral component of vertical-lateral travel may apply tangential friction forces to the skin of a finger pad in contact with the touchsurface, and cause deformation of the skin and finger pad that the user perceives as additional vertical travel. This then creates a tactile illusion of greater vertical travel. In some embodiments, returning the key from the pressed to the unpressed position on the return stroke also involves simulating greater vertical travel using lateral motion.

To enable the keys 120 of the keyboard 100 with vertical-lateral travel, the keys 120 are parts of key assemblies each comprising mechanisms for effecting planar translation, readying the key 120 by holding the associated keycap in the unpressed position, and returning the key 120 to the unpressed position. Some embodiments further comprise mechanisms for leveling keycaps. Some embodiments achieve these functions with a separate mechanism for each function, while some embodiments achieve two or more of these functions using a same mechanism. For example, a "biasing" mechanism may provide the readying function, the returning function, or both the readying and returning functions. Mechanisms which provide both readying and returning functions are referred to herein as "ready/return" mechanisms. As another example, a leveling/planar-translation-effecting mechanisms may level and effect planar translation. As further examples, other combinations of functions may be provided by a same mechanism.

The keyboard 100 may use any appropriate technology for detecting presses of the keys of the keyboard 100. For example, the keyboard 100 may employ a key switch matrix based on conventional resistive membrane switch technology. The key switch matrix may be located under the keys 120 and configured to generate a signal to indicate a key press when a key 120 is pressed. Alternatively, the example keyboard 100 may employ other key press detection technology to detect any changes associated with the fine or gross change in position or motion of a key 120. Example key press detection technologies include various capacitive, resistive, inductive, magnetic, force or pressure, linear or angular strain or displacement, temperature, aural, ultrasonic, optical, and other suitable techniques. With many of these technologies, one or more preset or variable thresholds may be defined for identifying presses and releases.

As a specific example, capacitive sensor electrodes may be disposed under the touchsurfaces, and detect changes in capacitance resulting from changes in press states of touchsurfaces. The capacitive sensor electrodes may utilize "self capacitance" (or "absolute capacitance") sensing methods based on changes in the capacitive coupling between the sensor electrodes and the touchsurface. In some embodiments, the touchsurface is conductive in part or in whole, or a conductive element is attached to the touchsurface, and held at a constant voltage such as system ground. A change in location of the touchsurface alters the electric field near the sensor electrodes below the touchsurface, thus changing the measured capacitive coupling. In one implementation, an absolute capacitance sensing method operates with a capacitive sensor electrode underlying a component having the touchsurface, modulates that sensor electrodes with respect to a reference voltage (e.g., system ground), and detects the capacitive coupling between that sensor electrode and the component having the touchsurface for gauging the press state of the touchsurface.

Some capacitive implementations utilize "mutual capacitance" (or "transcapacitance") sensing methods based on changes in the capacitive coupling between sensor electrodes. In various embodiments, the proximity of a touchsurface near the sensor electrodes alters the electric field between the sensor electrodes, thus changing the measured capacitive coupling. The touchsurface may be a conductive or non-conductive, electrically driven or floating, as long as its motion causes measurable change in the capacitive coupling between sensor electrodes. In some implementations, a transcapacitive sensing method operates by detecting the capacitive coupling between one or more transmitter sensor electrodes (also "transmitters") and one or more receiver sensor electrodes (also "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive.

In one implementation, a trans-capacitance sensing method operates with two capacitive sensor electrodes underlying a touchsurface, one transmitter and one receiver. The resulting signal received by the receiver is affected by the transmitter signal and the location of the touchsurface.

In some embodiments, the sensor system used to detect touchsurface presses may also detect pre-presses. For example, a capacitive sensor system may also be able to detect a user lightly touching a touchsurface, and distinguish that from the press of the touchsurface. Such a system can support multi-stage touchsurface input, which can respond differently to light touch and press.

Some embodiments are configured to gauge the amount of force being applied on the touchsurface from the effect that the force has on the sensor signals. That is, the amount of depression of the touchsurface is correlated with one or more particular sensor readings, such that the amount of press force can be determined from the sensor reading(s).

In some embodiments, substrates used for sensing are also used to provide backlighting associated with the touchsurfaces. As a specific example, in some embodiments utilizing capacitive sensors underlying the touchsurface, the capacitive sensor electrodes are disposed on a transparent or translucent circuit substrate such as polyethylene terephthalate (PET), another polymer, or glass. Some of those embodiments use the circuit substrate as part of a light guide system for backlighting symbols viewable through the touchsurfaces.

FIG. 1 also shows a section line A-A' relative to the key 122 of the keyboard 100, which will be discussed below.

The keyboard 100 may be integrated into or coupled to computer such as a laptop computer comprising one or more processing systems. The processing system(s) each comprise one or more ICs (integrated circuits) having appropriate processor-executable instructions for responding to key presses. These instructions direct the appropriate IC(s) to operate keyboard sensors to determine if a key has been pressed (or the extent of the press), and provide an indication of press status to a main CPU of the laptop or a response to the press status to a user of the laptop.

While the orientation terminology, vertical-lateral travel, sensing technology, and implementation options discussed here focuses on the keyboard 100, these discussions are readily analogized to other touchsurfaces and devices described herein.

Figure 2:
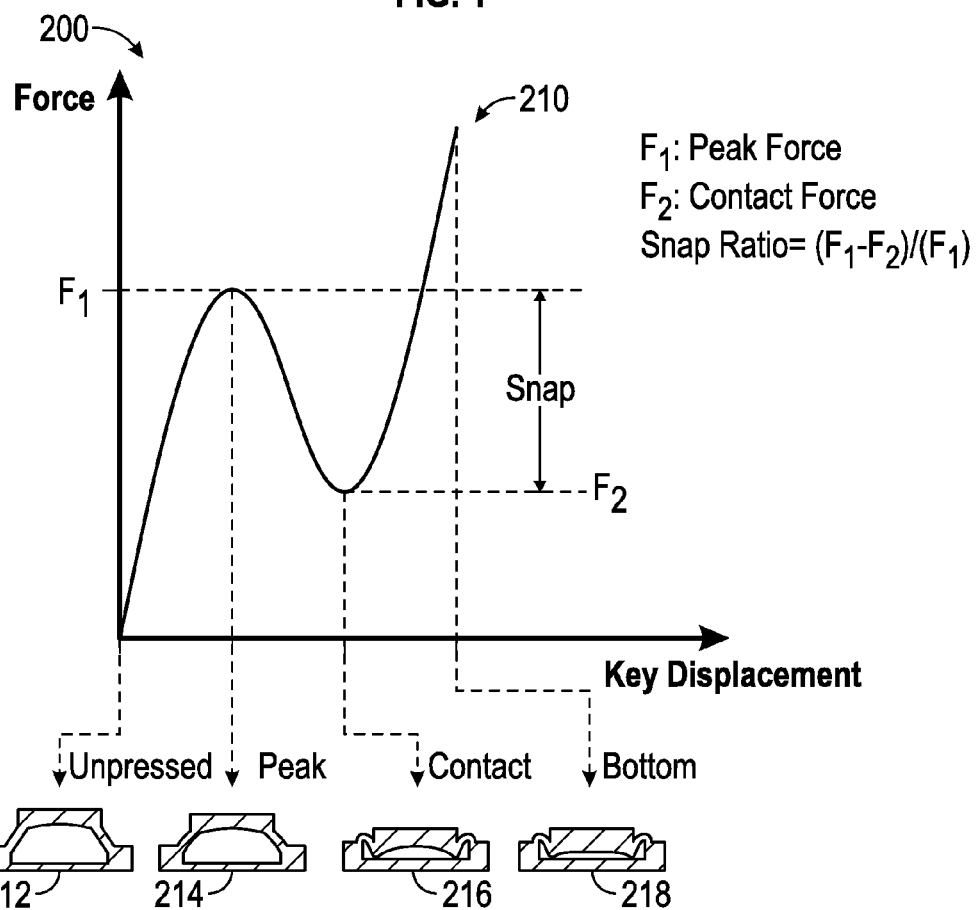
FIG. 2 is a graph of an example tactile response that is characteristic of many keys enabled with metal snap domes or rubber domes in accordance with the techniques described herein.

Various embodiments in accordance with the techniques described herein, including embodiments without metal snap domes or rubber domes, provide force response curves similar to the curve 210 of FIG. 2. Many tactile keyboard keys utilize snap ratios no less than 0.4 and no more than 0.6. Other tactile keyboard keys may use snap ratios outside of these ranges, such as no less than 0.3 and no more than 0.5, and no less than 0.5 and no more than 0.7.

Other embodiments provide other response curves having other shapes, including those with force and key travel relationships that are linear or nonlinear. Example nonlinear relationships include those which are piecewise linear, which contain linear and nonlinear sections, or which have constantly varying slopes. The force response curves may also be non-monotonic, monotonic, or strictly monotonic.

For example, the keys 120 made in accordance with the techniques described herein may be configured to provide the response shown by curve 210, or any appropriate response curve. The reaction force applied to a user may increase linearly or nonlinearly relative to an amount of total key travel, an amount of key travel the press direction, or an amount of key travel in a lateral direction. As a specific example, the force applied may increase with a constant slope relative to the amount of key travel for up to a first amount of force or key movement relative to its unpressed position, and then plateau (with constant force) or decrease for up to a second amount of force or key movement.

Figure 3A:
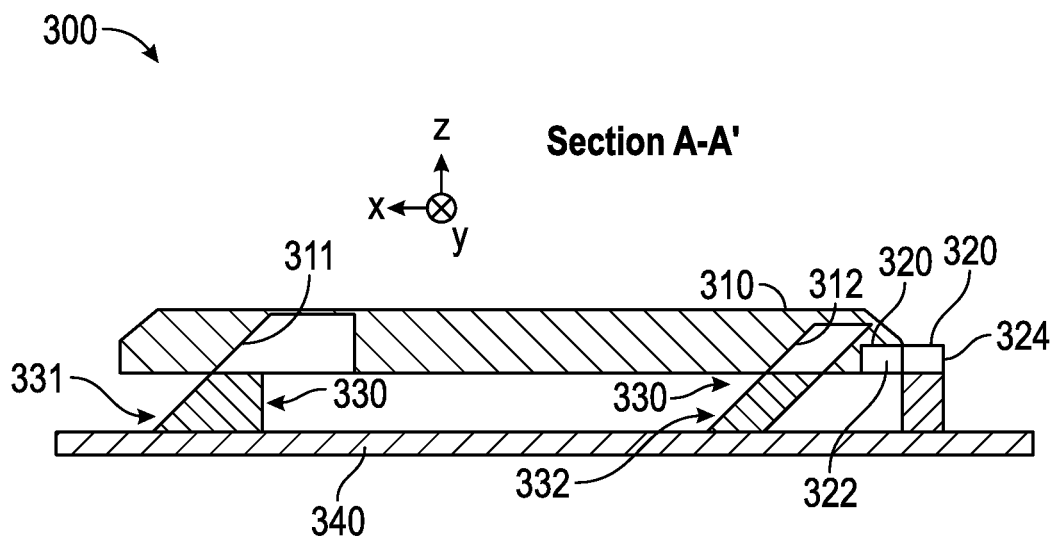
FIGS. 3A-3B are simplified side views of a first example touchsurface assembly configured in accordance with the techniques described herein.
Figure 3B:
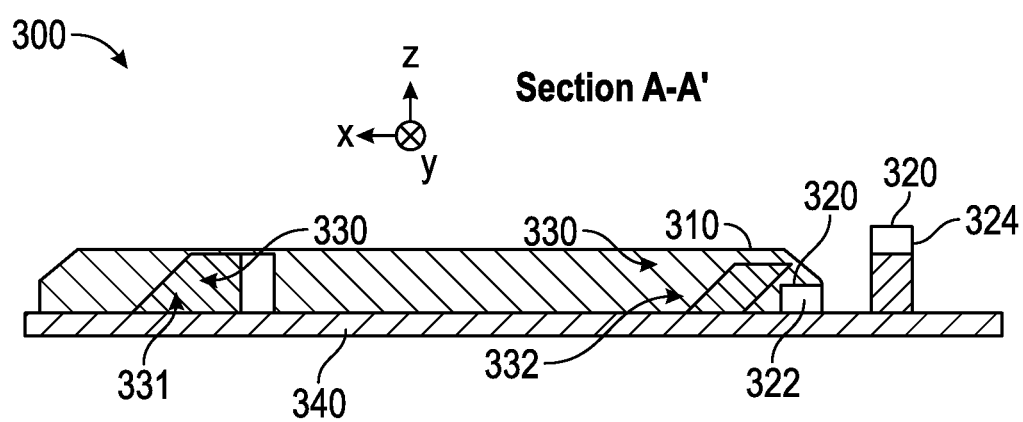

FIGS. 3A-3B are simplified cross-sectional views of a first example touchsurface assembly. The key assembly 300 may be used to implement various keys, including the key 122 of the keyboard 100. In the embodiment where FIGS. 3A-3B depict the key 122, these figures illustrate A-A' sectional views of the key 122. FIG. 3A shows the example key assembly 300 in an unpressed position and FIG. 3B shows the same key assembly 300 in a pressed position. The key assembly 300 may also be used in other devices utilizing keys, including keyboards other than the keyboard 100 and any other appropriate key-using device. Further, assemblies analogous to the key assembly 300 may be used to enable non-key touchsurface assemblies such as buttons, opaque touchpads, touchscreens, or any of the touchsurface assemblies described herein.

The key assembly 300 includes a keycap 310 that is visible to users and configured to be pressed by users, a ready/return mechanism 320, and a base 340. The unpressed and pressed positions of the keycap 310 are spaced in a press direction and in a first lateral direction orthogonal to the press direction. The press direction is analogous to the key motion found in conventional keyboards lacking lateral key motion, is in the negative-Z direction, and is the primary direction of press and key motion. In many keyboards the press direction is orthogonal to the touchsurface of the keycap or the base of the key, such that users would consider the press direction to be downwards toward the base.

The components of the key assembly 300 may be made from any appropriate material, including plastics such as polycarbonate (PC), acrylonitrile butadiene styrene (ABS), nylon, and acetal, metals such as steel and aluminum, elastomers such as rubber, and various other materials. In various embodiments, the keycap 310 is configured to be substantially rigid, such that the touchsurface of the keycap 310 appears to unaided human senses to move with rigid body motion between its unpressed and pressed positions during normal operation.

The ready/return mechanism 320 is a type of "biasing mechanism" that provides both readying and returning functions. The ready/return mechanism 320 physically biases the keycap 310 during at least part of the key press operation. It should be noted that a mechanism which only provides readying or returning function may also be termed a "biasing mechanism," if it biases the keycap 310 during at least part of the key press operation. The ready/return mechanism 320 is configured to hold the keycap 310 in its unpressed position so that the keycap 310 is ready to be pressed by a user. In addition, the ready/return mechanism 320 is also configured to return the keycap 310 partially or entirely to the unpressed position in response to a release of the press force to keycap 310. The release of the press force may be a removal of the press force, or a sufficient reduction of press force such that the key assembly is able to return the keycap 310 to the unpressed position as a matter of normal operation. In the example embodiment of FIG. 3, the key assembly 300 utilizes magnetically coupled components 322, 324 to form the ready/return mechanism 320. Magnetically coupled components 322, 324 may both comprise magnets, or one may comprise a magnet while the other comprise a magnetically coupled material such as a ferrous material. Although magnetically coupled components 322, 324 are each shown as a single rectangular shape, either or both magnetically coupled components 322, 324 may comprise non-rectangular cross-section(s) or comprise a plurality of magnetically coupled subcomponents having the same or different cross sections.

For example, magnetically coupled component 322 or 324 may comprise a magnetic, box-shaped subcomponent disposed against a central portion of a ferrous, U-shaped subcomponent.

In some implementations, the magnetically coupled component 322 is physically attached to a bezel or base proximate to the keycap 310. The magnetically coupled component 322 is physically attached to the keycap and magnetically interacts with the magnetically coupled component 324. The physical attachment of the magnetically coupled components 322, 324 may be direct or indirect (indirectly being through one or more intermediate components), and may be accomplished by press fits, adhesives, or any other technique or combination of techniques. The amount of press force needed on the keycap to overcome the magnetic coupling (e.g., overpower the magnetic attraction or repulsion) can be customized based upon the size, type, shape, and positions of the magnetically coupling components 322, 324 involved.

The key assembly 300 comprises a planar-translation-effecting (PTE) mechanism 330 configured to impart planar translation to the keycap 310 when it moves between the unpressed and pressed positions, such that a nonzero component of lateral motion occurs. The PTE mechanism 330 is formed from parts of the keycap 310 and the base 340, and comprises four ramps (two ramps 331, 332 are visible in FIGS. 3A-B) disposed on the base 340. These four ramps are located such that they are proximate to the corners of the keycap 310 when the key assembly 300 is assembled. In the embodiment shown in FIGS. 3A-B, these four ramps (including ramps 331, 332) are simple, sloped planar ramps located at an angle to the base 340. These four ramps (including ramps 331, 332) are configured to physically contact corresponding ramp contacting features (two ramp contacting features 311, 312 are visible in FIGS. 3A-B) disposed on the underside of the keycap 310. The ramp contacting features of the keycap 310 may be any appropriate shape, including ramps matched to those of the ramps on the base 340.

In response to a press force applied to the touchsurface of the keycap 310 downwards along the press direction, the ramps on the base 340 (including ramps 331, 332) provide reaction forces. These reaction forces are normal to the ramps and include lateral components that cause the keycap 310 to exhibit lateral motion. The ramps and some retention or alignment features that mate with other features in the bezel or other appropriate component (not shown) help retain and level the keycap 310. That is, they keep the keycap 310 from separating from the ramps and in substantially the same orientation when travelling from the unpressed to the pressed position.

As shown by FIGS. 3A-B, the keycap 310 moves in the press direction (negative Z-direction) in response to a sufficiently large press force applied to the top of the keycap 310. As a result, the keycap 310 moves in a lateral direction (in the positive X-direction) and in the press direction (in the negative Z-direction) due to the reaction forces associated with the ramps. The ramp contacting features (e.g., 311, 312) of the keycap 310 ride on the ramps of the base 340 (e.g., 331, 332) as the keycap 310 moves from the unpressed to the pressed position. This motion of the keycap 310 moves the magnetically coupled components 322, 324 relative to each other, and changes their magnetic interactions.

FIG. 3B shows the keycap 310 in the pressed position. For the key assembly 300, the keycap 310 has moved to the pressed position when it directly or indirectly contacts the base 340 or has moved far enough to be sensed as a key press. FIG. 3A-B do not illustrate the sensor(s) used to detect the press state of the keycap 310, and such sensor(s) may be based on any appropriate technology, as discussed above.

When the press force is released, the ready/return mechanism 320 returns the keycap 310 to its unpressed position. The attractive forces between the magnetically coupled components 322, 324 pull the keycap 310 back up the ramps (including the ramps 331, 322), toward the unpressed position.

Many embodiments using magnetic forces utilize permanent magnets. Example permanent magnets include, in order of strongest magnetic strength to the weakest: neodymium iron boron, samarium cobalt, alnico, and ceramic. Neodymium-based magnets are rare earth magnets, and are very strong magnets made from alloys of rare earth elements. Alternative implementations include other rare earth magnets, non-rare earth permanent magnets, and electromagnets.

Although the key assembly 300 utilizes magnetically coupled components to form its ready/return mechanism 320, various other techniques can be used instead or in addition to such magnetic techniques in other embodiments. In addition, separate mechanisms may be used to accomplish the readying and returning functions separately. For example, one or more mechanisms may retain the keycap in its ready position and one or more other mechanisms may return the keycap to its ready position. Examples of other readying, returning, or ready/return mechanisms include buckling elastomeric structures, snapping metallic domes, deflecting plastic or metal springs, stretching elastic bands, bending cantilever beams, and the like. In addition, in some embodiments, the ready/return mechanism push (instead of pull) the keycap 310 to resist keycap motion to the pressed position or to return it to the unpressed position. Such embodiments may use magnetic repulsion or any other appropriate technique imparting push forces.

Many variations of or additions to the components of the key assembly 300 are possible. For example, other embodiments may include fewer or more components. As a specific example, another key assembly may incorporate any number of additional aesthetic or functional components. Some embodiments include bezels that provide functions such as hiding some of the key assembly from view, protecting the other components of the key assembly, helping to retain or guide the touchsurface of the key assembly, or some other function.

As another example, other embodiments may comprise different keycaps, readying mechanisms, returning mechanisms, PTE mechanisms, leveling mechanisms, or bases. As a specific example, the keycap 310, the base 340, or another component that is not shown may comprise protrusions, depressions, or other features that help guide or retain the keycap 310. As another specific example, some embodiments use non-ramp techniques in place or (or in addition to) ramps to effect planar translation. Examples other PTE mechanisms include various linkage systems, cams, pegs and slots, bearing surfaces, and other motion alignment features.

As yet another example, although the PTE mechanism 330 is shown in FIGS. 3A-B as having ramps disposed on the base 340 and ramp contacting features disposed on the keycap 310, other embodiments may have one or more ramps disposed on the keycap 310 and ramp contacting features disposed on the base 340. Also, the PTE mechanism 330 is shown in FIGS. 3A-B as having ramps 331, 332 with simple, sloped plane ramp profiles. However, in various embodiments, the PTE mechanism 330 may utilize other profiles, including those with linear, piecewise linear, or nonlinear sections, those having simple or complex curves or surfaces, or those including various convex and concave features. Similarly, the ramp contacting features on the keycap 310 may be simple or complex, and may comprise linear, piecewise linear, or nonlinear sections. As some specific examples, the ramp contacting features may comprise simple ramps, parts of spheres, sections of cylinders, and the like. Further, the ramp contacting features on the keycap 310 may make point, line, or surface contact the ramps on the base 340 (including ramps 331, 332). "Ramp profile" is used herein to indicate the contour of the surfaces of any ramps used for the PTE mechanisms. In some embodiments, a single keyboard may employ a plurality of different ramp profiles in order to provide different tactile responses for different keys.

As a further example, embodiments which level their touchsurfaces may use various leveling techniques which use none, part, or all of the associate PTE mechanism.

Figure 4:
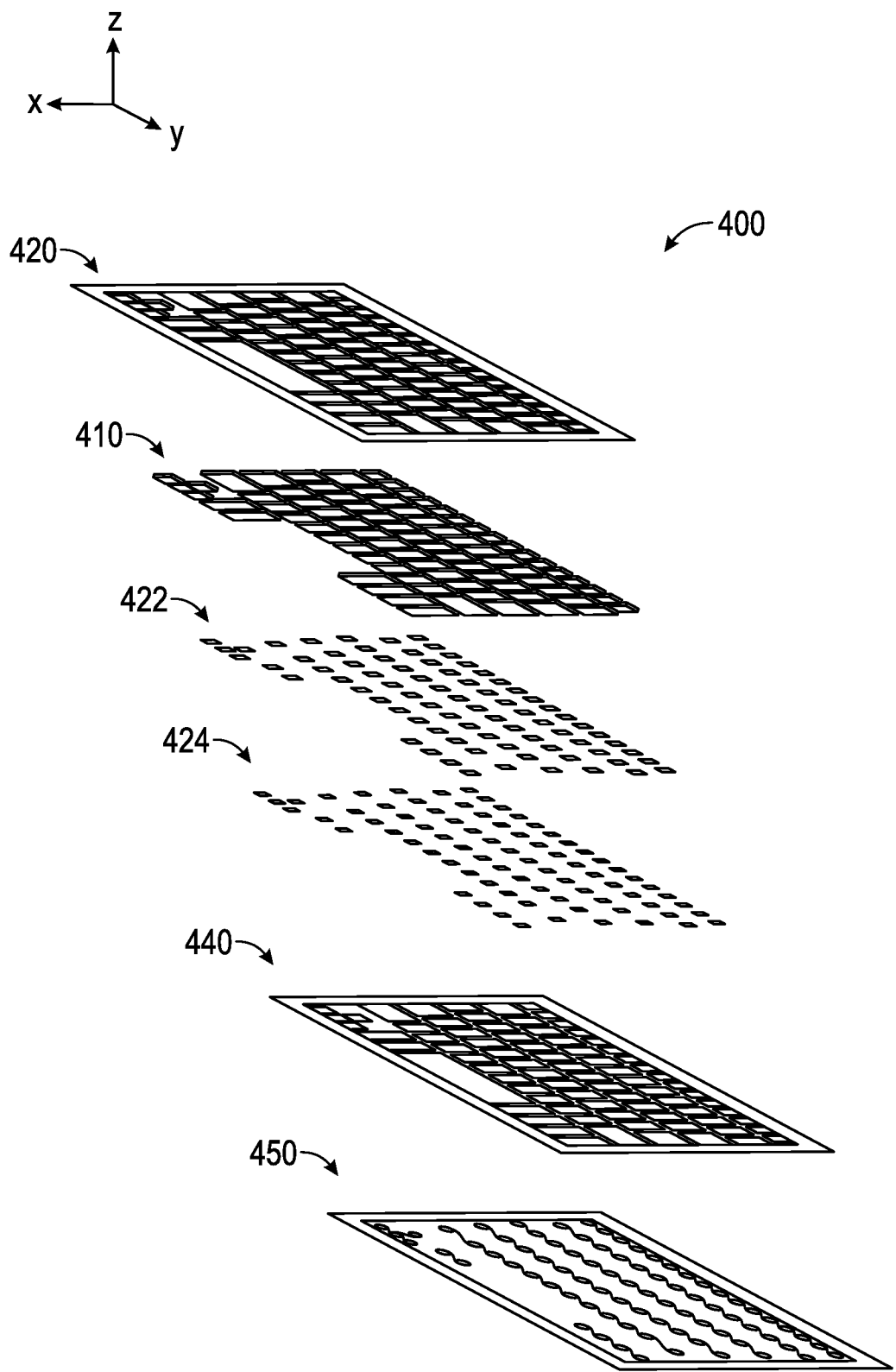
FIG. 4 shows an exploded view of an example keyboard in accordance with the techniques described herein.

FIG. 4 shows an exploded view of an example keyboard construction 400 in accordance with the techniques described herein. A construction like the keyboard construction 400 may be used to implement any number of different keyboards, including keyboard 100. Proceeding from the top to the bottom of the keyboard, the bezel 420 comprises a plurality of apertures through which keycaps 410 of various sizes are accessible in the final assembly. Magnetically coupled components 422, 424 are attached to the keycaps 410 or the base 440, respectively. The base 440 comprises a plurality of PTE mechanisms (illustrated as simple rectangles on the base 440) configured to guide the motion of the keycaps 410. Underneath the base 440 is a key sensor 450, which comprises one or more layers of circuitry disposed on one or more substrates.

Various details have been simplified for ease of understanding. For example, adhesives that may be used to bond components together are not shown. Also, various embodiments may have more or fewer components than shown in keyboard construction 400, or the components may be in a different order. For example, the base and the key sensor 450 may be combined into one component, or swapped in the stack-up order.

Figure 5:
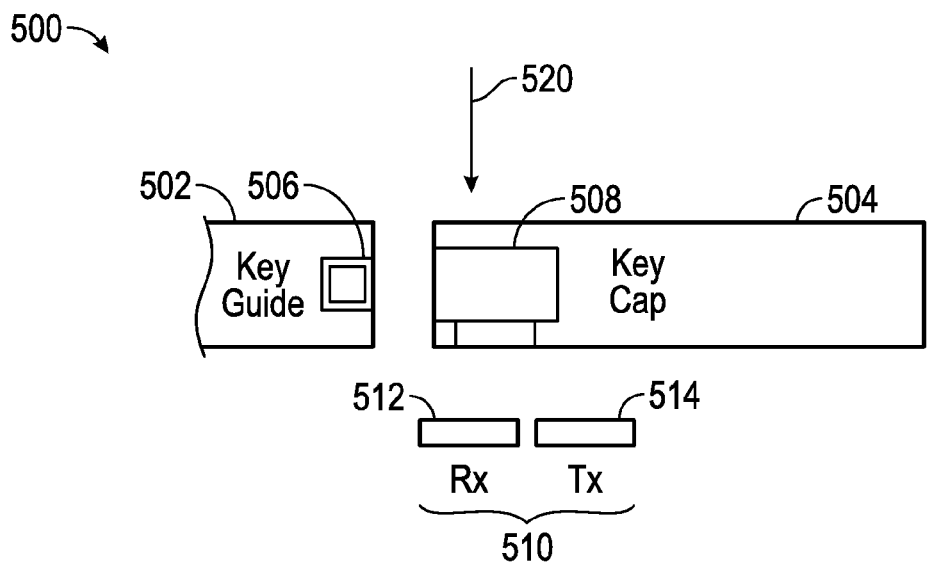
FIG. 5 is a schematic layout diagram of an exemplary key assembly including a stationary key guide magnet, a movable key cap magnet, and a transmitter/receiver electrode pair underlying the key cap in accordance with the techniques described herein.

Referring now to FIG. 5, an exemplary key assembly 500 includes a stationary key guide 502 having a first conductive portion 506, a movable key cap 504 having a second conductive portion 508, and a transmitter/receiver electrode pair 510 including a transmitter electrode 514 and a receiver electrode 512 underlying the key cap 504. One or both of the first and second conductive portions 506, 508 may be made from a ferromagnetic material such as a permanent magnet. As described above, a user applies force generally along the direction of arrow 520 to the top of the key cap 504, resulting in a downward keystroke. When the user removes the applied force, the magnetic attraction between the first and second conductive portions 506, 508 restores the key cap to the nominal position shown in FIG. 5.

Figure 6:
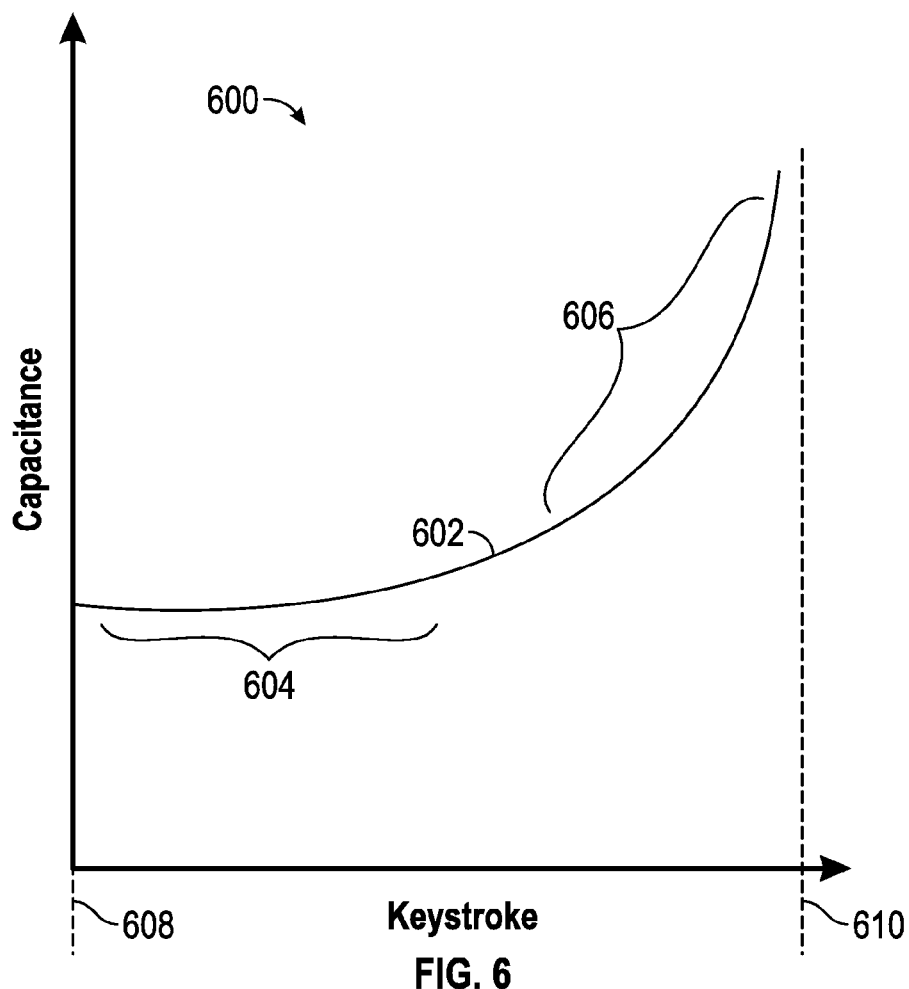
FIG. 6 is a graph representing the change in capacitive coupling between the movable key cap magnet and the underlying electrode pair of FIG. 5 versus a downward keystroke in accordance with the techniques described herein.

Referring now to FIGS. 5 and 6, FIG. 6 is a graph 600 representing the change in capacitive coupling between the movable key cap 504 and the underlying electrode pair 510 (FIG. 5) versus a downward keystroke. More particularly, the graph 600 includes a response curve 602 illustrating the capacitance change between the transmitter electrode 514 and the receiver electrode 512 as the key cap 514 moves downwardly from a top keystroke position 608 to a bottom keystroke position 610. Notably, the initial portion 604 of the response curve 602 is relatively flat as compared to the latter portion 606 of the curve 602. This reflects the inverse square relationship between: i) the distance between the key cap 504 and the electrode pair 510; and ii) the resulting measured capacitance between the transmitter electrode 514 and the receiver electrode 512 as the key cap (specifically, the magnet 508) moves closer to the electrodes.

With continued reference to FIGS. 5 and 6, the position of the key cap 504 at virtually any point during a keystroke may be determined by measuring the capacitance between the transmitter electrode 514 and the receiver electrode 512. However, the relatively flat response portion 604 limits the ability of assembly 500 to accurately measure key cap position during the early portion of a keystroke.

Figure 7:
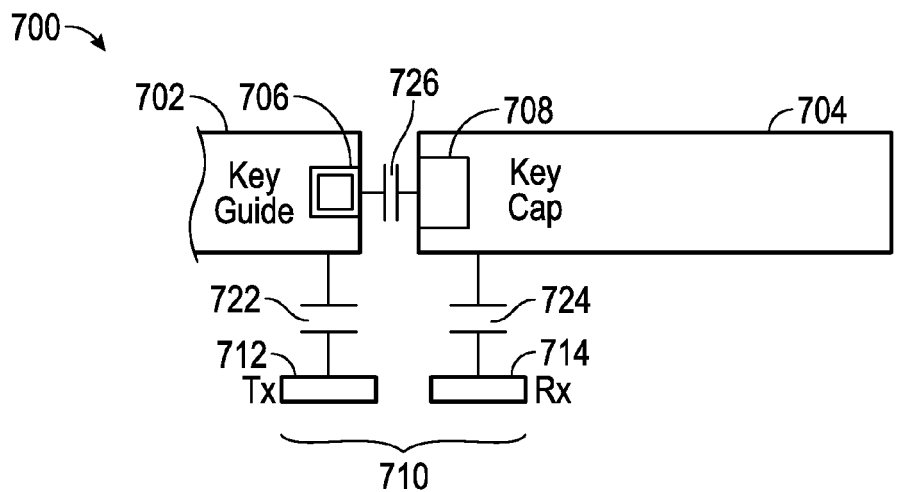
FIG. 7 is a schematic layout diagram of an exemplary key assembly including a stationary key guide magnet, a movable key cap magnet, and a transmitter/receiver electrode pair wherein one of the electrodes underlies the key cap and the other electrode underlies the key guide in accordance with the techniques described herein.

An alternative embodiment of the key assembly of FIG. 5 is shown in FIG. 7. In particular, FIG. 7 illustrates a key assembly 700 including a stationary key guide 702 having a first conductive portion (e.g., magnet) 706, a movable key cap 704 having a second conductive portion (e.g., magnet) 708, and a transmitter/receiver electrode pair 710 including a transmitter electrode 712 and a receiver electrode 714. In the illustrated embodiment, the receiver electrode 714 is disposed under the key cap 704, and the transmitter electrode 712 is disposed under the key guide 702. Alternatively, the receiver electrode 714 may be disposed under the key guide 702, and the transmitter electrode 712 may be disposed under the key cap 704.

As the key cap 704 moves downwardly, the position of the key cap 704 during the downward keystroke may be determined based on a measured capacitance change between the transmitter electrode 712 and the receiver electrode 714. In this regard, those skilled in the art will appreciate that the conductive components 706, 708 and electrodes 712, 714 potentially interact with and influence the various capacitances between and among each other. To facilitate the ensuing discussion surrounding FIG. 8, however, the following capacitances are depicted schematically: i) a first capacitance 722 between the transmitter electrode 712 and the first conductive component 706; ii) a second capacitance 726 between the first conductive component 706 and the second conductive component 708; and iii) a third capacitance 724 between the receiver electrode 714 and the second conductive component 708. Changes in these capacitances (and perhaps other capacitances not shown) during a keystroke combine to produce a net capacitance change which may be measured between the transmitter electrode 712 and the receiver electrode 714.

Figure 8:
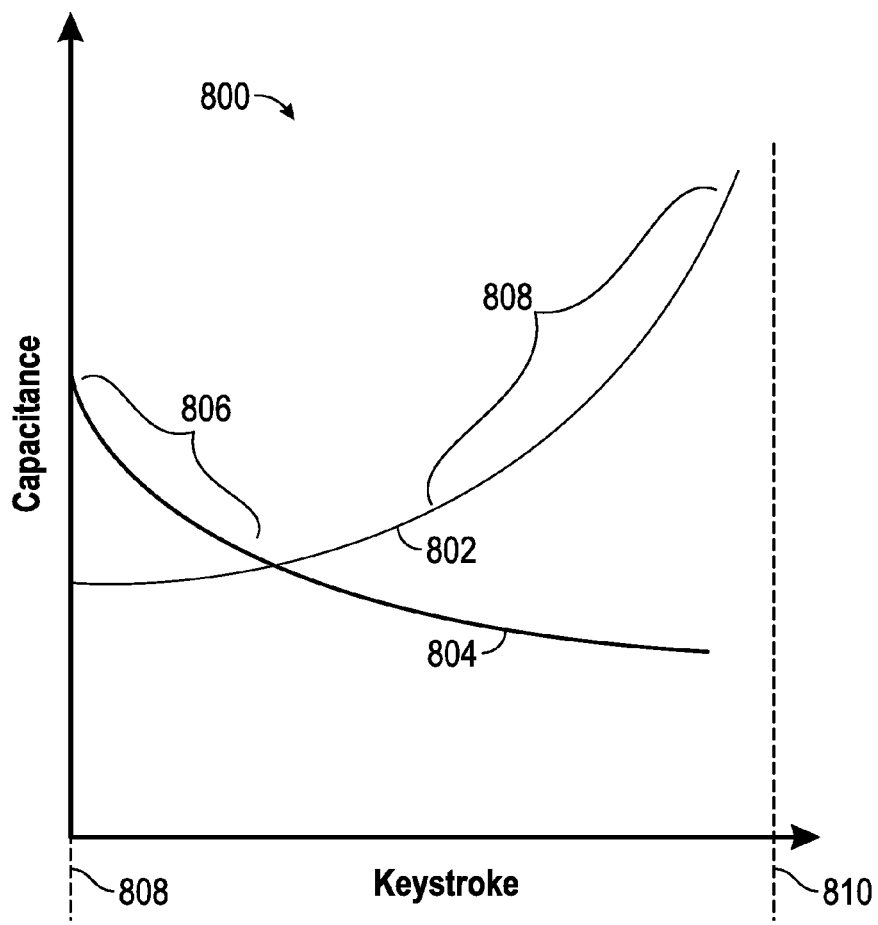
FIG. 8 is a graph of a first signal representing the change in capacitive coupling between the movable key cap magnet and the underlying electrode pair of FIG. 7 versus a downward keystroke, superimposed upon a second signal representing the change in capacitive coupling between the stationary key guide magnet and the movable key cap magnet of FIG. 7 versus a downward keystroke in accordance with the techniques described herein.

Referring now to FIGS. 7 and 8, FIG. 8 is a graph 800 of a first signal 802 representing the change in capacitive coupling between the moving key cap 704 and the underlying the receiver electrode 714 versus a downward keystroke, and a second signal 804 representing the change in capacitive coupling between the conductive component 706 and the conductive component 708 during the same downward keystroke. As discussed above in connection with FIGS. 5 and 6, a downward keystroke generally refers to a user pressing the key cap 704 downwardly from a top keystroke position 808 to a bottom keystroke position 810. The first signal 802 generally corresponds to the third capacitance 724, and the second signal 804 generally corresponds to the second capacitance 726. In the illustrated embodiment, the first capacitance 722 remains relatively constant during a keystroke.

Notably, the second signal 804 includes a relatively high gain (slope) portion 806 associated with an early portion of the keystroke, while the first signal 802 includes a relatively high gain portion 806 associated with a latter portion of the keystroke. Consequently, the first and second signals 802, 804 may be subtracted, filtered, or otherwise combined with each other in a manner which enhances the determination of key cap position during both the early and latter stages of a keystroke.

Figure 9:
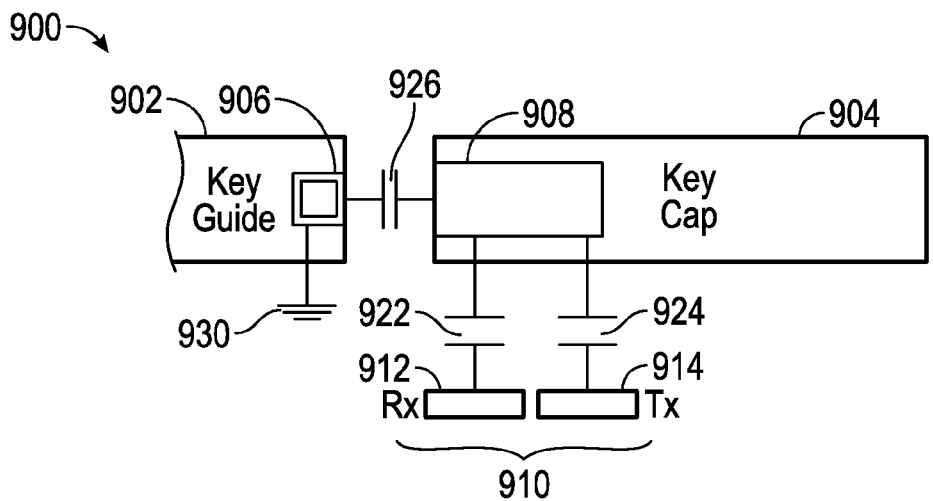
FIG. 9 is an alternate embodiment of the key assembly of FIG. 5 illustrating the electrode pair disposed underneath the key cap, and a grounded key guide magnet in accordance with the techniques described herein.

FIG. 9 is a further alternate embodiment of the key assemblies of FIGS. 5 and 7. In particular, FIG. 9 illustrates a key assembly 900 including a stationary key guide 902 having a first conductive portion (e.g., magnet) 906, a movable key cap 904 having a second conductive portion (e.g., magnet) 908, and a transmitter/receiver electrode pair 910 including a transmitter electrode 914 and a receiver electrode 912. In the illustrated embodiment, the receiver electrode 912 and the transmitter electrode 914 are both disposed under the key cap 904, and the key guide magnet 906 is grounded or otherwise maintained at a constant voltage potential via a ground element 930.

As the key cap 904 moves downwardly, the position of the key cap 904 may be determined from a measured capacitance change between the transmitter electrode 912 and the receiver electrode 914. In this regard, those skilled in the art will appreciate that the conductive components 906, 908 and electrodes 912, 914 potentially interact with and influence the various capacitances between and among each other. To facilitate the ensuing discussion surrounding FIG. 9, however, the following capacitances are depicted schematically: i) a first capacitance 926 between the first conductive component 906 and the second conductive component 908; ii) a second capacitance 922 between the receiver electrode 912 and the second conductive component 908; and iii) a third capacitance 924 between the transmitter electrode 914 and the second conductive component 908. Changes in these capacitances (and perhaps other capacitances not shown) during a keystroke combine to produce a net capacitance change which may be measured between the transmitter electrode 914 and the receiver electrode 912.

Figure 10:
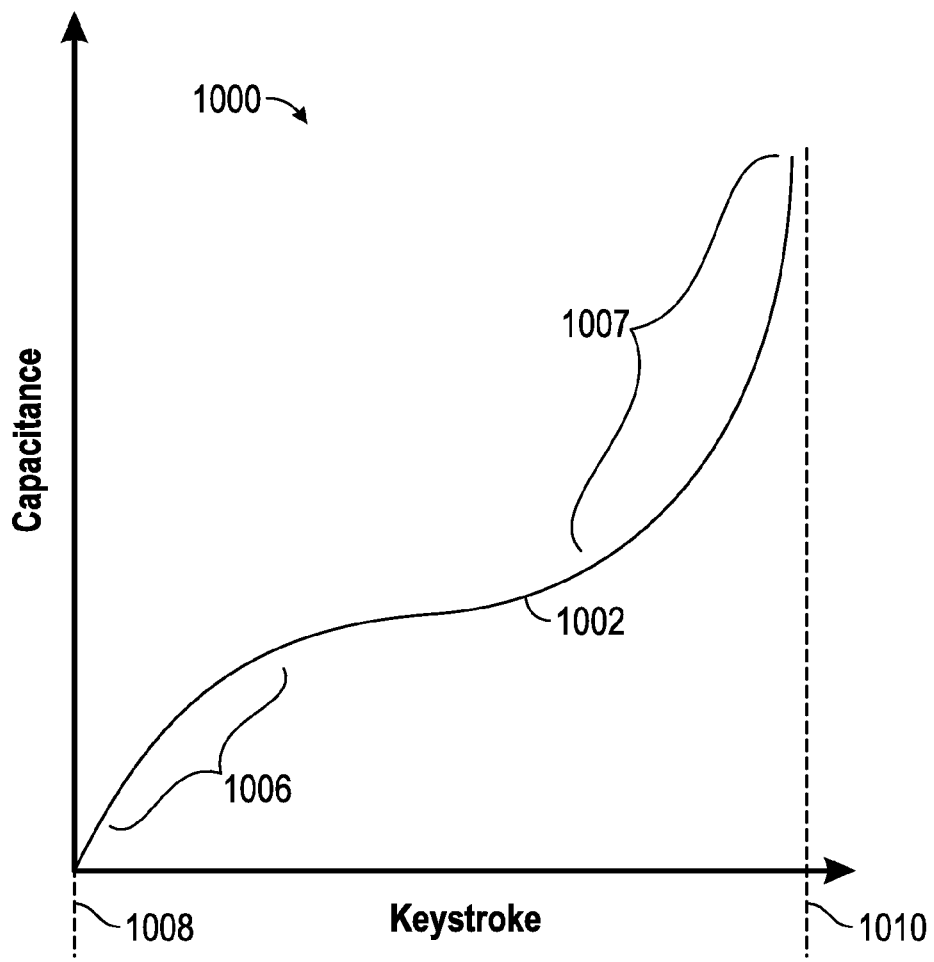
FIG. 10 is a graph of a composite signal representing the total change in capacitance between the electrode pair of FIG. 9 versus a downward keystroke in accordance with the techniques described herein.

Referring now to FIGS. 9 and 10, FIG. 10 is a graph 1000 of a signal 1002 representing the change in capacitive coupling between the transmitter electrode 914 and a receiver electrode 912 during a downward keystroke, for example, from a top (nominal) keystroke position 1008 to a bottom keystroke position 1010. The signal 1002 includes a first relatively high gain (slope) portion 1006 associated with an early portion of the keystroke. The high gain portion 1006 generally corresponds to the capacitance 926, which is inverted with respect to the analogous capacitance 726 of FIG. 7 as a result of maintaining the first conductive portion 906 at a constant potential via ground element 930. Note that the high gain portion 1006 increases sharply as the second conductive portion 908 moves away from the first conductive portion 906 during the early part of a keystroke.

The signal 1002 further includes a second relatively high gain portion 1007 associated with a latter portion of the keystroke. The second high gain portion 1007 generally corresponds to the capacitances 922 and 924, which increase sharply as the second conduction portion 908 approaches the electrode pair 910. Consequently, the signal 1002 exhibits a steep slope—or a high gain—during both the early and latter stages of a keystroke, thereby facilitating a more accurate determination of key cap position throughout the entire keystroke.

Figure 11:
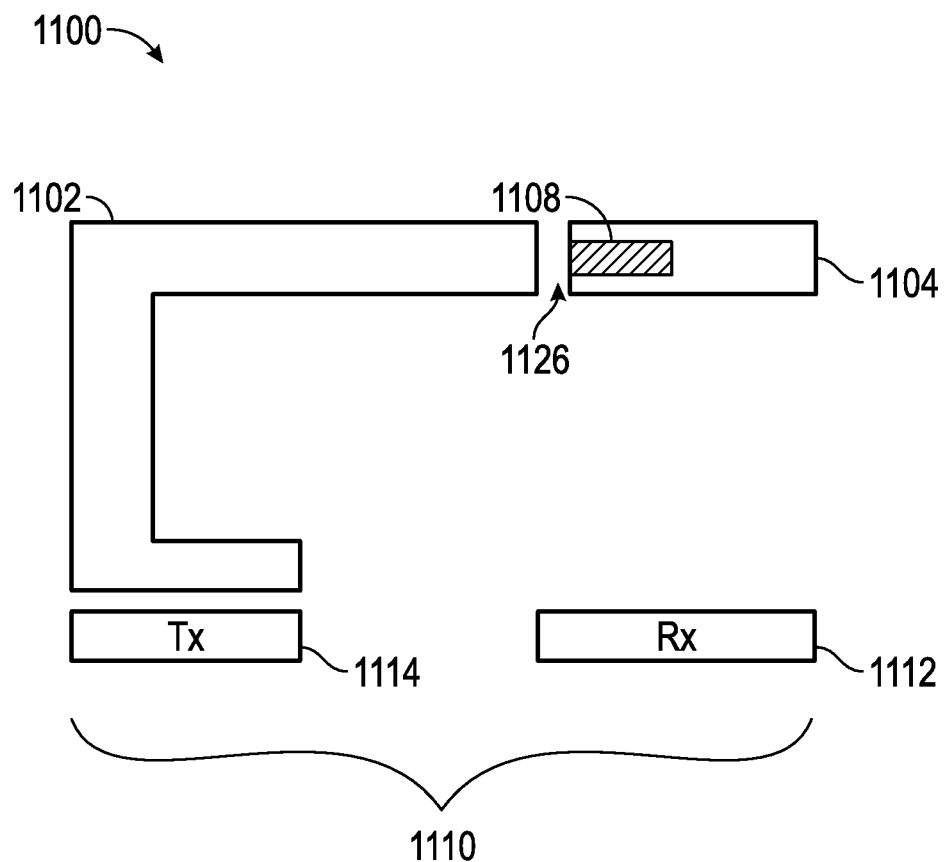
FIG. 11 is a schematic layout diagram of a further alternate embodiment of a key assembly including a stationary key guide magnet in the form of a ferromagnetic clip disposed above a transmitter electrode, and a movable key cap magnet disposed above a receiver electrode in accordance with the techniques described herein.

FIG. 11 is a schematic layout diagram of a further alternate embodiment of a key assembly 1100 including a stationary key guide 1102 in the form of a ferromagnetic clip disposed above a transmitter electrode 1114, and a movable key cap 1104 including a key cap magnet 1108 disposed above a receiver electrode 1112 in accordance with the techniques described herein. The transmitter electrode 1114 and the receiver electrode 1112 form an electrode pair 1110. In the illustrated embodiment, the receiver electrode 1112 is disposed under the key cap 1104, and the transmitter electrode 1114 is disposed under the key guide 1102. Alternatively, the receiver electrode may be disposed under the key guide 1102, and the transmitter electrode may be disposed under the key cap 704.

The position of the key cap 1104 during a keystroke may be determined from a measured capacitance between the electrode pair 1110. In this regard, the particular configuration of the ferromagnetic key guide 1102 (e.g., arced or clip shaped) may be manipulated to increase the sensitivity of the capacitance between the electrode pair 1110 during the initial portion of a keystroke by increasing the capacitive coupling at a capacitance 1126 between the key guide 1102 and the key cap magnet 1108.

A keyboard is thus provided which includes a plurality of key assemblies, wherein each of at least a subset of the key assemblies comprises: a key guide having a first conductive portion; a key cap having a second conductive portion; a transmitter electrode; and a receiver electrode disposed underneath the second conductive portion. The first and second conductive portions may be configured to cooperate magnetically to return the key cap to a nominal position following a keystroke, and the first transmitter electrode and first receiver electrode may be configured to form a variable capacitance in response to the keystroke.

In an embodiment, the transmitter electrode is disposed beneath the key guide. The transmitter electrode, the receiver electrode, and the first and second conductive portions are configured to form: a first capacitance between the receiver electrode and the second conductive portion; a second capacitance between the first and second conductive portions; and a third capacitance between the transmitter electrode and the first conductive portion; wherein the variable capacitance comprises the first, second, and third capacitances.

Alternatively, the transmitter electrode may be disposed beneath the key cap, and the first conductive portion may be electrically grounded or otherwise configured to be maintained at a substantially constant electrical potential.

In an embodiment, one or both of the first and second conductive portions comprise a magnet.

In another embodiment, each of the subset of key assemblies further comprises a planar-translation-effecting (PTE) mechanism configured to impart planar, vertical, and lateral motion to the key cap when pressed by a user.

A key assembly is also provided for use in a keyboard. The assembly includes a key guide including a first magnetic component, a key cap including a second magnetic component and configured to be pressed downwardly relative to the key guide, and a keystroke sensor configured to measure a variable capacitance between the first and second magnetic components during a keystroke.

In an embodiment, the keystroke sensor includes a transmitter electrode and a receiver electrode, where at least one of the transmitter electrode and the receiver electrode may be disposed underneath the key cap.

In an embodiment, one of a transmitter electrode and a receiver electrode is disposed underneath the key cap, and one of the transmitter electrode and the receiver electrode is disposed underneath the key guide.

In another embodiment, the keyboard comprises at least two key assemblies, where the same transmitter may be associated with the at least two key assemblies.

In an further embodiment, the variable capacitance further comprises a first capacitance between the first and second magnetic components, and a second capacitance between the keystroke sensor and the second magnetic component.

In another embodiment, the first capacitance decreases during a downward keystroke, and the second capacitance increases during a downward keystroke.

A method is also provided for detecting the keystroke motion and/or position of a keyboard key responsive to applied force by an input object. The method involves determining the keystroke motion based on a first and second capacitance, where the first capacitance may be formed between a stationary key guide and the key, and the second capacitance may be formed between a stationary keystroke sensor and the key. One or both of the first and second capacitances may comprise a variable capacitance In an embodiment, the stationary keystroke sensor comprises a transmitter and receiver electrode pair, wherein at least one of the transmitter and receiver electrode is disposed underneath the key.

In another embodiment, the first capacitance decreases with downward motion of the key, and the second capacitance increases with downward motion of the key.

In an embodiment, determining the keystroke motion based on a first and second capacitance comprises measuring a composite third capacitance.

In an embodiment, the same transmitter may be associated with at least two keyboard keys.

The method may also include the step of imparting planar, vertical, and lateral motion to the key during a keystroke.

The techniques described herein can be used to implement any number of devices utilizing different touchsurface assemblies, including a variety of keyboards each comprising one or more key assemblies in accordance with the techniques described herein. Some components may be shared when multiple touchsurfaces are placed in the same device. For example, the base may be shared by two or more touchsurfaces. As another example, the keyswitch sensor may be shared through sharing sensor substrates, sensor electrodes, or the like.

The implementations described herein are meant as examples, and many variations are possible. As one example, any appropriate feature described with one implementation may be incorporated with another. As a first specific example, any of the implementations described herein may or may not utilize a finishing tactile, aesthetic, or protective layer. As a second specific example, ferrous material may be used to replace magnets in various magnetically coupled component arrangements.

In addition, the structure providing any function may comprise any number of appropriate components. For example, a same component may provide leveling, planar translation effecting, readying, and returning functions for a key press. As another example, different components may be provide these functions, such that a first component levels, a second component effects planar translation, a third component readies, and a fourth component returns. As yet another example, two or more components may provide a same function. For example, in some embodiments, magnets and springs together provide the return function, or the ready and return functions. Thus, the techniques described in the various implementations herein may be used in conjunction with each other, even where the function may seem redundant. For example, some embodiments use springs to back-up or augment magnetically-based ready/return mechanisms.

What is claimed is:

1. A keyboard comprising a plurality of key assemblies, wherein each of at least a subset of the key assemblies comprises:
    a key guide having a first conductive portion;
    a key cap having a second conductive portion;
    a transmitter electrode; and
    a receiver electrode disposed underneath the second conductive portion;
    wherein the first and second conductive portions cooperate magnetically to return the key cap to a nominal position following a keystroke; and
    wherein the first transmitter electrode and first receiver electrode form a variable capacitance in response to the keystroke.

2. The keyboard of claim 1, wherein the transmitter electrode is disposed beneath the key guide.

3. The keyboard of claim 1, wherein the transmitter electrode, the receiver electrode, and the first and second conductive portions are configured to form: a first capacitance between the receiver electrode and the second conductive portion; a second capacitance between the first and second conductive portions; and a third capacitance between the transmitter electrode and the first conductive portion; wherein the variable capacitance comprises the first, second, and third capacitances.

4. The keyboard of claim 1, wherein the transmitter electrode is disposed beneath the key cap, and wherein the first conductive portion is configured to be maintained at a substantially constant electrical potential.

5. The keyboard of claim 1, wherein at least one of the first and second conductive portions comprises a magnet.

6. The keyboard of claim 1, wherein each of the subset of key assemblies further comprises a planar-translation-effecting (PTE) mechanism configured to impart planar, vertical, and lateral motion to the key cap when pressed by a user.

* * * * *